US008552459B2

(12) United States Patent
Herrmann et al.

(10) Patent No.: US 8,552,459 B2
(45) Date of Patent: Oct. 8, 2013

(54) RADIATION-EMITTING COMPONENT AND METHOD FOR ITS MANUFACTURE (75) Inventors: Siegfried Herrmann, Neukirchen (DE); Sebastian Taeger, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 143 days.

(21) Appl. No.: 13/129,018

(22) PCT Filed: Nov. 5, 2009

(86) PCT No.: PCT/DE2009/001571
§ 371 (c)(1),
(2), (4) Date: Jul. 28, 2011

(87) PCT Pub. No.: WO2010/054628
PCT Pub. Date: May 20, 2010

(65) Prior Publication Data
US 2011/0278621 A1    Nov. 17, 2011

(30) Foreign Application Priority Data

Nov. 14, 2008    (DE) .................... 10 2008 057 350

(51) Int. Cl.
*H01L 33/00* (2010.01)
*H01L 29/08* (2006.01)

(52) U.S. Cl.
USPC ................. 257/99; 257/79; 257/40; 257/100; 257/E33.01; 257/676

(58) Field of Classification Search
USPC ................. 257/12, 13, 14, 40, 79, 80, 81, 82, 257/88, 89, 90, 91, 94, 95, 96, 97, 98, 99, 257/100, 101, 102, 103, 228, 257, 258, 414, 257/431, 432, 433, 435, 437, 440, 676, 734, 257/735, 736, 778, 787, 788, 792, E33.01, 257/E33.056, E33.057, E33.058, E33.059
See application file for complete search history.

(56) References Cited

U.S. PATENT DOCUMENTS 5,401,827 A       3/1995 Holmes et al.
5,973,337 A  *   10/1999 Knapp et al. ............... 257/99

(Continued)

FOREIGN PATENT DOCUMENTS

CN            1718534         1/2006
DE     10 2005 063 106 A1    7/2007

(Continued)

OTHER PUBLICATIONS

STIC Search Report, 2013.*

(Continued)

*Primary Examiner* — Cuong Q Nguyen
*Assistant Examiner* — Galina Yushina
(74) *Attorney, Agent, or Firm* — DLA Piper LLP (US)

(57) ABSTRACT

A radiation-emitting component includes a carrier, a semi-conductor chip arranged on the carrier, wherein the semi-conductor chip includes an active layer to generate electromagnetic radiation and a radiation exit surface, a first and a second contact structure for the electrical contacting of the semi-conductor chip, a first and a second contact layer, wherein the semi-conductor chip is electrically conductively connected to the first contact structure via the first contact layer and to the second contact structure via the second contact layer, a passivation layer arranged on the semi-conductor chip.

16 Claims, 7 Drawing Sheets

(56) References Cited

U.S. PATENT DOCUMENTS

| | | |
|---|---|---|
| 6,111,272 A | 8/2000 | Heinen |
| 6,740,906 B2 * | 5/2004 | Slater et al. .................... 257/99 |
| 2004/0084682 A1 | 5/2004 | Illek et al. |
| 2005/0233484 A1 * | 10/2005 | Stein et al. .................... 438/22 |
| 2006/0261292 A1 | 11/2006 | Kim et al. |
| 2007/0231963 A1 | 10/2007 | Doan et al. |
| 2010/0001264 A1 * | 1/2010 | Aramaki et al. .............. 257/40 |
| 2010/0187514 A1 * | 7/2010 | Nakano et al. ................ 257/40 |

FOREIGN PATENT DOCUMENTS

| | | |
|---|---|---|
| DE | 10 2006 045 702 A1 | 4/2008 |
| EP | 0 905 797 A2 | 3/1999 |
| WO | 02/13281 A1 | 2/2002 |
| WO | 2007/076842 | 7/2007 |

OTHER PUBLICATIONS

Gorham, W.F., "A New, General Synthetic Method for the Preparation of Linear Poly-*p*-xylylenes," *Journal of Polymer Science: Part A-1*, 1966, vol. 4, pp. 3027-3039.

Schnitzer I. et al.; "30% external quantum efficiency from surface textured, thin-film light-emitting diodes," Appl. Phys. Lett. 63 (16), Oct. 1993, pp. 2174-2176.

* cited by examiner

RADIATION-EMITTING COMPONENT AND METHOD FOR ITS MANUFACTURE

RELATED APPLICATIONS

This is a §371 of International Application No. PCT/DE2009/001571, with an international filing date of Nov. 5, 2009 (WO 2010/054628, published May 20, 2010), which is based on German Patent Application No. 10 2008 057 350.7, filed Nov. 4, 2008, the subject matter of which is incorporated by reference.

TECHNICAL FIELD

This disclosure relates to a radiation-emitting component and methods of producing the component.

BACKGROUND

A common problem of radiation-emitting components is the production of an efficient encapsulation of these components. The material that is used for the encapsulation should have a very good barrier effect, for example, against acids, lyes, gases and water vapor. At the same time, however, it should also form very thin uniform layers and be transparent for the radiation emitted from the component.

It could therefore be helpful to provide a radiation-emitting component comprising a passivation layer which has a very good barrier effect, for example, against acids, lyes, gases and water vapor and at the same time is transparent for the radiation emitted by the component.

SUMMARY

We provide a radiation-emitting component including a carrier, a semi-conductor chip arranged on the carrier, wherein the semi-conductor chip has an active layer to generate electromagnetic radiation, and a radiation exit surface, a first and a second contact structure that electrically contacts the semi-conductor chip, a first and, a second contact layer, wherein the semi-conductor chip is electrically conductively connected to the first contact structure via the first contact layer and to the second contact structure via the second contact layer, a passivation layer arranged on the semi-conductor chip, wherein the passivation layer includes an organic polymer, with the general formula (I):

wherein $R^1$ to $R^{16}$ are in each case independent from one another, may be H, $CH_3$, F, Cl or Br, and n has a value from 10 to 500,000.

We also provide a method for manufacturing a radiation-emitting component including A) providing a carrier which includes a first and a second contact structure, B) mechanically and electrically conductive connecting a semi-conductor chip to the first contact structure via a first contact layer, C) mechanically and electrically conductive connecting the semi-conductor chip to the second contact structure via a second contact layer, D) applying a passivation layer on at least sections of the semi-conductor chip, wherein the passivation layer includes an organic polymer with the general formula (I):

wherein $R^1$ to $R^{16}$ are in each case independent from one another, may be H, $CH_3$, F, Cl or Br, and n has a value from 10 to 500,000.

DETAILED DESCRIPTION

Our radiation-emitting component may comprise a carrier, a semi-conductor chip arranged on the carrier, wherein the semi-conductor chip has an active layer to generate electromagnetic radiation and a radiation exit surface, a first and a second contact structure for the electrical contacting of the semi-conductor chip, a first and a second contact layer, wherein the semi-conductor chip is electrically conductively connected to the first contact structure via the first contact layer and to the second contact structure via the second contact layer, a passivation layer arranged on the semi-conductor chip wherein the passivation layer comprises an organic polymer or consists thereof, with the general formula (I):

(I)

wherein $R^1$ to $R^{16}$ are in each case independent from one another, may be H, $CH_3$, F, Cl of Br, and n has a value from 10 to 500,000.

A passivation layer, which comprises an organic polymer with the formula provided above, has a good hydrophobic and chemical resistance. The passivation layer has thus a good barrier effect against, for example, acids, lyes, gases arid water vapor. The passivation layer is furthermore transparent for the radiation emitted by the component. A further advantage of the passivation layer is that very thin and uniform layers can be formed. Furthermore the passivation layer has a good temperature resistance. It also has a good resistance to mechanical stress such as abrasion. As a result of these properties, the parts of the radiation-emitting component coated with the passivation layer are very well protected against environmental influences.

The radiation-emitting component may be constructed such that in each case $R^1$, $R^2$, $R^7$, $R^8$, $R^9$, $R^{10}$, $R^{15}$ and $R^{16}$ are H.

n may have a value from 100 to 100,000.

One or two substituents $R^3$ to $R^6$ on one side and $R^{11}$ to $R^{14}$ on the other side may each be $CH_3$, F, Cl, Br.

In the case that there are two substituents on one aromatic component, these will preferably be the same group.

An organic polymer of this formula has a particularly good barrier, effect against environmental influences. At the same time, particularly thin and uniform passivation layers can be formed on the component.

The passivation layer may comprise an organic polymer of the formula:

A passivation layer which comprises such an organic polymer has a very good dielectric strength, wherein additionally the dielectric constant is independent of the frequency of the electrical field. Furthermore, particularly uniform layers can be formed with a passivation layer which comprises such an organic polymer. With this material, small spaces, gaps and edges can be filled. The passivation layer is also particularly suitable as an insulating layer based on the dielectric constant and the low dielectric loss factor of the polymer.

The passivation layer may comprise an organic polymer of the formula:

A passivation layer, which comprises the organic polymer shown above, has very good electrical and physical properties. For example, the passivation layer has a very good barrier effect against moisture and gases. A passivation layer which comprises such an organic polymer adheres more quickly to the surface on which it is applied compared with the corresponding organic polymer which does not comprise any chlorine atoms.

The passivation layer may comprise an organic polymer of the formula:

A passivation layer which comprises an organic polymer whose aromatic compound has two chlorine atoms has a higher thermal stability compared with the passivation layers whose organic polymers comprise aromatic compounds having only one or no chlorine atoms.

The passivation layer may be the outermost layer of the component, at least in sections.

Because of the very good barrier properties of me passivation layer, it is possible to externally encapsulate the radiation-emitting component by the passivation layer against environmental influences such as gases or water vapor or chemically aggressive media. In this connection, the passivation layer can be the outer layer of the component. The outer layer is understood to be a layer, that in the case of a layer sequence of, for example, several layers laid horizontally over each other, represents at least in sections the uppermost or lowermost layer. Not understood to be an outer layer is a layer which is arranged between other layers and only has contact to the environment by the vertical sides.

The passivation layer may be arranged on the radiation exit surface.

The layer thickness can lie within a range from 100 nm to 2000 nm, preferably in a range from 200 nm to 1000 nm.

Due to the transparency of the passivation layer, this layer can be applied on the radiation exit surface of the semi-conductor chip. The semi-conductor chip can thereby be encapsulated by the passivation layer against environmental influences.

The passivation layer may be arranged directly on the radiation exit surface.

Arranged directly on the radiation surface is understood to mean that, at least in sections, there are no further intermediate layers between the passivation layer and the semi-conductor layer. The very good barrier properties of the passivation layer make it possible to do without further barrier layers. This, combined with the property that the passivation layer can be formed as a very thin and very uniform layer, enables the realization of very flat components.

At least one optical element may be arranged on the radiation exit surface of the semiconductor chip.

As a result of the optical element, the radiation emitted by the semi-conductor chip can be spatially deflected or modified in its wavelength.

The optical element comprises a conversion layer or a filter.

In the conversion layer, the radiation emitted by the semi-conductor chip can be modified in its wavelength. This can also take place, for example, only with a specific wavelength range of the emitted radiation. The modification can occur, for example, as a result of absorption of the radiation by a conversion substance, the radiation is then re-emitted in another wavelength. The filter can, for example, be an angle filter or an edge filter.

The passivation layer may be arranged at least on sections of the surface of the optical element facing away from the semi-conductor chip.

In that instance, the passivation layer encapsulates not only the semi-conductor chip, but also additionally the optical element arranged on the semi-conductor chip. As a result, not only the semi-conductor chip, but also the optical element is protected from environmental influences. There are also constructions conceivable in which there is additionally an equalizing layer arranged between the semi-conductor chip and the optical element. The equalizing layer here is a special form of the passivation layer and thereby comprises the same substances as the passivation layer. These can, for example, serve to straighten the surface of the semi-conductor chip.

The passivation layer electrically may insulate the first contact structure against the second contact structure.

Because of the good electrical insulating properties of the organic polymer, the passivation layer can also be used as an electrical insulator. In this connection, for example, the first contact structure can be electrically insulated against the second contact structure.

The passivation layer may electrically insulate the second contact layer against the first contact layer.

Since the organic polymer and thereby also the passivation layer not only has very good electrical insulating properties, but with this layer very thin and uniform layers can also be formed, it is also possible to fill small intermediate spaces with the passivation layer. Furthermore, it is also possible to lead contact layers in a ramp-like manner over a base which is formed by the passivation layer. Ramp-like is understood to mean that the contact layer is directly led over another layer without an intermediate space being formed between the contact layer and the layer over which it is led. This enables the realization of particularly flat components. For this example which comprises such a contact ramp, no contact wire (a so-called "bonding wire") is required.

The second contact layer may be arranged on the radiation exit surface of the semi-conductor chip in a frame-like manner.

This enables the semi-conductor chip to be supplied with voltage by all sides also on the side of the radiation exit surface. Consequently, the semiconductor chip has a more even voltage supply as if the contact layer was arranged on just one side of the radiation exit surface. As a result of the fact that the semi-conductor chip is evenly supplied with voltage, it shows a more homogeneous emission compared with a semi-conductor chip which is only supplied with voltage in a punctiform manner or via one edge.

As a result of the frame-shaped arrangement of the second contact layer on the surface of the semi-conductor chip, the current spreading is improved, whereby the efficiency of the generation of radiation is improved. The frame-like contact geometry of the second contact layer is particularly suitable for chips with a side length of less than 400 µm.

The second contact layer may comprise contact webs arranged on the radiation exit surface of the semi-conductor chip.

This arrangement of the second contact layer likewise enables the supply of voltage to the semi-conductor chip in a homogeneous way which in turn leads to a homogeneous emission of the semi-conductor chip. The contact webs can be transparent for the emitted radiation. In this connection, the second contact layer is preferably additionally arranged in a frame-shaped manner on the surface of the semi-conductor chip, wherein, in this frame contact, contact webs are arranged which preferably do not cross each other on the surface of the semi-conductor chip and particularly preferably run parallel to each other. The contact webs thereby are, in sections, in direct contact with the frame contact.

As a result of the contact webs, the current spreading of the semi-conductor chip improves, whereby greater chip dimensions are possible. Such a contact structure is particularly advantageous for chips with a side length greater than 400 µm.

There may be a first and a second through-connection in the carrier, wherein the first through-connection is electrically conductively connected to the first contact structure and the second through-connection is electrically conductively connected to the second contact structure.

This enables the first or second contact structure to be able to be electrically contacted straight from the underside and thus through the carrier. Consequently very flat components can be achieved. As a result of a contacting of the semi-conductor chip via through-connections which lead through the carrier, the radiation-emitting component can be designed so that it can be surface mounted. Components that can be surface mounted or so-called "SMT" components (SMT: Surface Mount Technology), are distinguished by the fact that they can, for example, be soldered directly onto a circuit board by solderable contact areas. As a result, very dense assemblies are possible whereby the required space is minimized. This allows for a high packing density.

The component may be formed as a thin-film chip.

The semi-conductor chip may be a thin-film light-emitting diode chip. In particular, it may comprise a carrier substrate on its reverse side. In one example, the first and the second contact layers, at least in some places, are arranged between the semi-conductor layer sequence and the carrier substrate.

A thin-film light-emitting diode chip is distinguished by at least one of the following characteristic features:
  on one main surface facing towards a carrier element, in particular the carrier substrate, of the radiation-generating semi-conductor layer sequence which is in particular a radiation-generating epitaxial layer sequence, a reflecting layer is applied or formed, which reflects back at least a part of the electromagnetic radiation generated in the semi-conductor layer sequence to this semi-conductor layer sequence;

the thin-film light-emitting diode chip has a carrier element, which is not a growth substrate, on which the semi-conductor layer sequence was epitaxially grown, but a separate carrier element that was subsequently attached to the semi-conductor layer sequence;

the semi-conductor layer sequence has a thickness in the range 20 µm or less, in particular in the range 10 µm or less;

the semi-conductor layer sequence is free from a growth substrate. In this case, "free from a growth substrate" means that a growth substrate used for growth is removed from the semiconductor layer sequence or at least highly thinned. In particular, it is thinned in such a way that it is not solely self-supporting by itself or together with the epitaxial layer sequence. The remaining residue of the highly thinned growth substrate is in particular unsuitable as such for the function of a growth substrate; and the semi-conductor layer sequence contains at least one semi-conductor layer with at least one surface that comprises a mixed structure, which ideally leads to a distribution of light approaching an ergodic distribution of light in the semi-conductor layer sequence, in other words, it comprises a stochastic scattering behavior that is as ergodic as possible.

A basic principle of a thin-film light-emitting diode chip is described, for example, in I. Schnitzer et al., Appl. Phys. Lett. 63 (16) 18. October 1993, pages 2174-2176, the subject matter of which is incorporated by reference. Examples of thin-film light-emitting diode chips are described in EP 0905797 A2 and WO 02/13281 A1, the subject matter of which is incorporated by reference.

The component may appear entirely white. As a result of a very thin and transparent encapsulation with the passivation layer, a change to the color impression can be avoided.

With the passivation layer, components such as LED chips can be encapsulated, the contacts of which are formed both as intermediate layers and components in which the contacts for electrical contacting are arranged on the surface.

The passivation layer can, for example, in the case that it is arranged on the chip flanks, also be used as an electrical flashover protection towards an electrically conductive basic body/carrier.

Furthermore, the passivation layer can also be used for the passivation of a mirror layer, for example, in the semi-conductor chip.

In addition to the component itself, a method for its manufacturing is also disclosed.

The steps for manufacturing the radiation-emitting component comprise providing a carrier, which comprises a first and a second contact structure as method step A), mechanical and electrical connecting of the semi-conductor chip to the first contact structure via the first contact layer as method step B), mechanical and electrical connecting of the semi-conductor chip to the second contact structure via the second contact layer as method step C), applying the passivation layer on at least sections of the semi-conductor chip as method step D), wherein for the passivation layer a material is used which comprises an organic polymer with the general formula (I):

(I)

wherein $R^1$ to $R^{16}$ are in each case independent from one another, may be H, $CH_3$, F, Cl or Br, and n has a value from 10 to 500,000.

In such a method, for example, a radiation-emitting component can be manufactured. Based on this method, components can be achieved which are very well protected against environmental influences such as acids, lyes, gases and water vapor. Furthermore, using this method, very flat components can be realized. Further advantageous examples of the method result in a similar manner to the advantageous examples of the radiation-emitting component.

In a further variation of the method, the passivation layer is applied using a plasma method.

In the plasma method, for example, the corresponding dimer of the respective polymer can serve as a starting substance. This can be thermally cleaved, for example, into the monomer from which chain formation then takes place to form a polymer. Polymerization then takes place at a temperature that is lower than the temperature required for cleaving the dimer. Polymerization can take place at a pressure in the range from 0.05 to 0.5 mbar. Condensation of the polymer can then take place directly on the surface to be coated.

With the plasma method, very thin and very uniform layers, can be applied which nevertheless exhibits a very good barrier effect.

Deposition of the passivation layer can also take place using chemical vapor deposition (CVD) or plasma enhanced chemical vapor deposition (PECVD).

In the following discussion, alternative aspects are explained in more detail using figures and examples.

Figure 1:
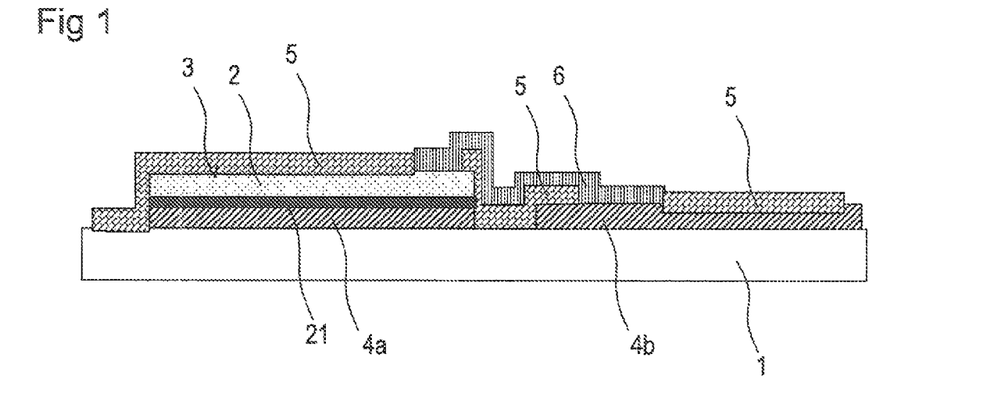
FIG. 1 shows a schematic side view of an example of the radiation-emitting device in which the second contact layer is formed as a ramp.

FIG. 1 shows a schematic side view of an example of the radiation-emitting component. The first contact structure 4a and the second contact structure 4b are arranged on the carrier 1. Both the contact structures are electrically insulated from each other by the passivation layer 5, The semi-conductor chip 2 is both mechanically and electrically conductively connected via the first contact layer 21 to the first contact structure 4a. The semi-conductor chip 2 has a radiation exit surface 3. At the radiation exit/surface 3, the semi-conductor chip 2 is electrically conductively connected to the second contact structure 4b via the second contact layer 6. The second contact layer 6 is led here in a ramp-like manner over the passivation layer 5, wherein the passivation layer 5 electrically insulates hereby the second contact layer 6 from the first contact structure 4a. The areas of the radiation exit surface 3 which are not in contact with the second contact layer 6 and the side surfaces of the semi-conductor chip 2 are coated with the passivation layer 5. As a result, the semi-conductor chip 2 is protected against environmental influences. Since the passivation layer 5 is transparent for the radiation emitted by the semi-conductor chip 2, the radiation can be emitted via the radiation exit surface 3 through the passivation layer 5.

As a result of the contacting of the semi-conductor chip 2, which can be effected without a bonding wire, optical elements can be arranged close to the chip on the semi-conductor chip 2.

The carrier 1 preferably contains a ceramic, silicon or aluminum nitride. Alternatively, the carrier 1 can comprise an intermetallic ceramic, a metal or a metal alloy with an electrically insulating layer arranged thereon, for example, a dielectric.

The semi-conductor chip 2 has an active layer which may have a pn-transition, a double heterostructure, a single quantum well structure (SQW) or a multiple quantum well structure (MQW) for the generation of radiation.

The semi-conductor chip 2 is preferably based on a nitride, a phosphite or an arsenide compound semi-conductor. The phrase "Based on nitride, phosphite or arsenide compound semi-conductors" means that the active epitaxial layer sequence or at least one layer thereof, comprises a III/V-semi-conductor material, in particular with the composition $In_xGa_yAl_{1-x-y}P$ or $In_xGa_yAl_{1-x-y}N$ or $In_xGa_yAl_{1-x-y}As$, in each case with $0 \leq x \leq 1$, $0 \leq y \leq 1$ and $x+y \leq 1$.

The semi-conductor chip 2 of the radiation-emitting component does not comprise a growth substrate. The semi-conductor chip 2 is thus formed as a substrateless semi-conductor chip. As a result of a substrateless semi-conductor chip 2, there results advantageously a particularly low design height of the component. Preferably, the semi-conductor chip 2 has a height of less than 100 μm, in particular preferably less than 40 μm. The dimension of the component can thus virtually lie in the range of the thickness of an epitaxial layer sequence.

The first contact layer 21 acts preferably not just as the electrical contacting of the semiconductor chip 2, but can further take on the function of an optical reflector. This means that the first contact layer 21 reflects back the radiation emitted by the semi-conductor chip 2 which is emitted in the direction of carrier 1, preferably in the direction of the radiation exit surface 3 of the semi-conductor chip 2.

Preferably, the second contact layer 6 is transparent and is in particular a TCO layer (TCO: Transparent Conductive Oxide). Particularly preferably, the second contact layer comprises IZO (indium zinc oxide), ITO (indium tin oxide) or ZnO (zinc: oxide).

Preferably, the second contact layer 6 has a thickness: in a range between 50 nm inclusively and 300 nm inclusively. The semi-conductor chip 2 preferably, has a height of less than 40 nm.

Figure 2:
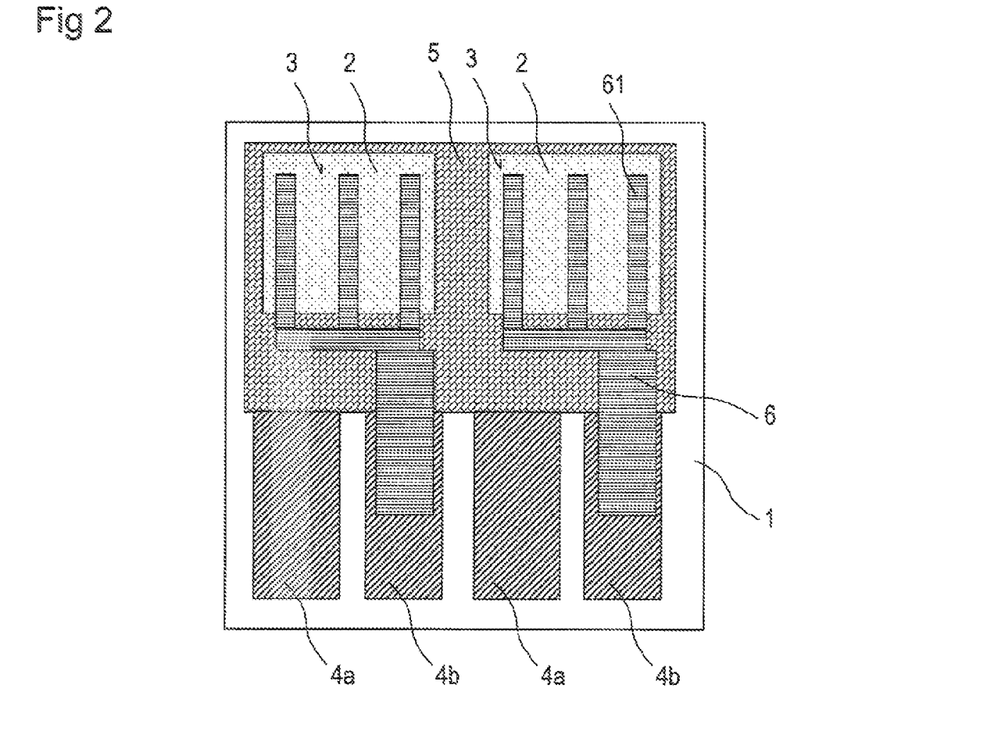
FIG. 2 shows a schematic overview of an example of the radiation-emitting component wherein sections of the second contact layer are formed as contact webs.

FIG. 2 shows the schematic overview of two radiation-emitting components. The two components are identically constructed and arranged on the same carrier 1. On the carrier 1, in each case a first contact structure 4a is arranged via which the semi-conductor chip or the first contact layer 21, which is, arranged between the semi-conductor chip 2 arid the first contact structure 4a, can be contacted. The upper side of the semi-conductor chip 2 is electrically conductively connected to the second contact structure 4a via the second contact layer 6. The second contact layer 6 is formed as contact webs 61 on the radiation exit surface 3. These contact webs 61 enable the semi-conductor chip 2 to be homogeneously supplied with voltage, which leads to a more homogeneous emission of the semiconductor chip 2. Both semi-conductor chips 2 are in each case surrounded in a frame-like manner by the passivation layer 5. The second contact layer 6 is led in a ramp-like manner, as illustrated in FIG. 1, over a section of the passivation layer 5 to the radiation exit surface 3.

Figure 3:
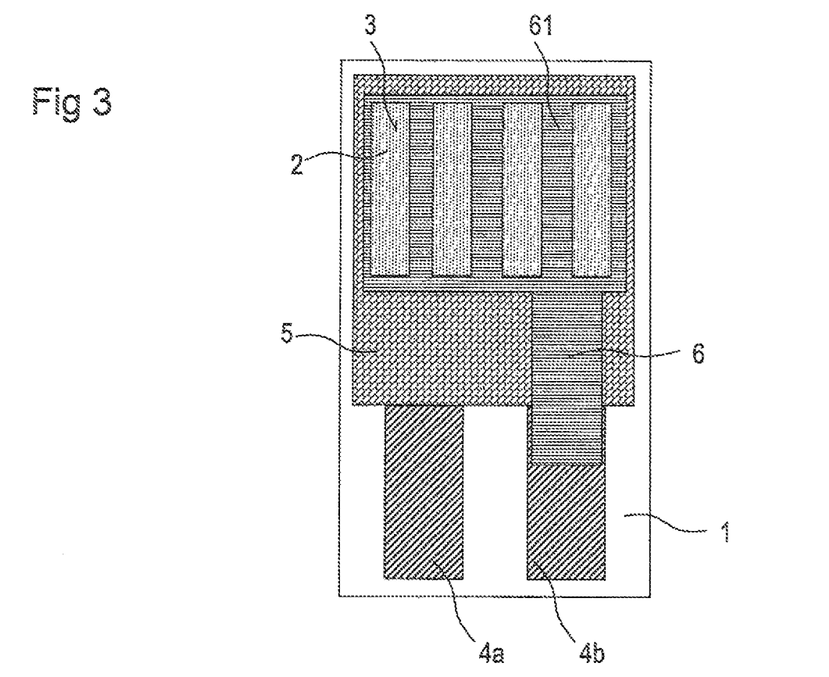
FIG. 3 shows a schematic overview of an example of the radiation-emitting component in which the contact webs are connected in a frame-like manner.

FIG. 3 shows a schematic overview of a further example of the radiation-emitting component. A first contact structure 4a and a second contact structure 4b are arranged on the carrier 1. The radiation exit surface 3 of the semi-conductor chip 2 is electrically conductively connected to the second contact structure 4b via the second contact layer 6. The section of the second contact layer 6 arranged on the radiation exit surface 3 is formed in parts as contact webs 61 and additionally as a frame which in each case the outer ends of the contact webs 61 with each other. In this example, the semi-conductor chip 2 is homogeneously supplied with voltage. The semi-conductor chip 2 is surrounded by the passivation layer 5. The passivation layer 5 also acts as the base for the second contact layer 6 which is led from the second contact structure 4b to the radiation exit surface 3.

Figure 4:
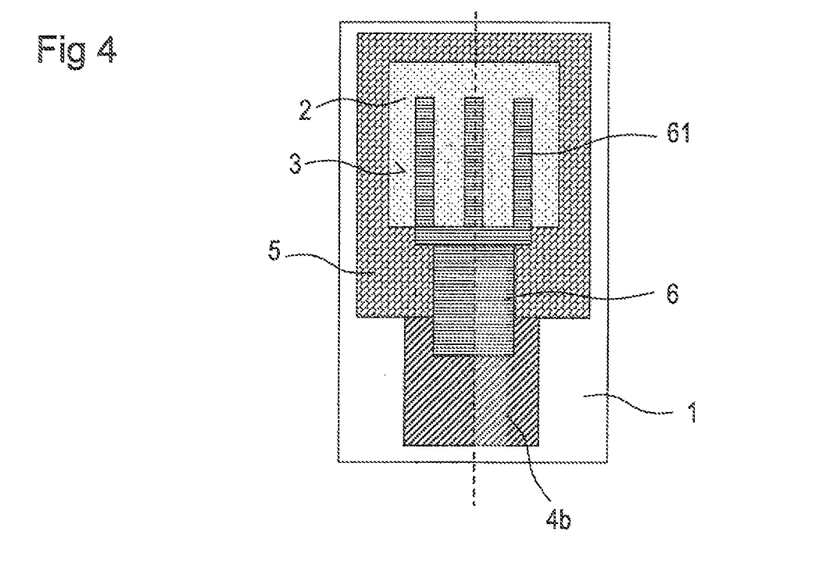
FIG. 4 shows a schematic overview of a further example of the radiation-emitting component which comprises a symmetrical composition.

FIG. 4 shows an example of the radiation-emitting component in the schematic overview. This example is characterized by the fact that it comprises a symmetrical composition with regard to the dotted line. The second contact layer 6 is also formed as contact webs 61 on the radiation exit surface 3 of the semi-conductor chip 2. The symmetrical composition of the component ensures a particularly homogeneous voltage supply of the semi-conductor chip 2 which leads to a particularly homogeneous emission characteristic of the semi-conductor chip.

In addition to the examples illustrated in FIGS. 2, 3 and 4, there are also examples in each case in which the radiation exit surface 3, at least in the areas in which there are no webs or contact layers, is completely coated with the passivation layer 5. For reasons of clarity, this is not illustrated in the figures. Consequently, the semi-conductor chip 2 is entirely protected in each case from environmental influences. Examples are also possible in which the contact webs 61 are also additionally provided with a passivation layer 5 so that the entire surface over the radiation exit surface 3 is provided with a passivation layer 5.

Figure 5:
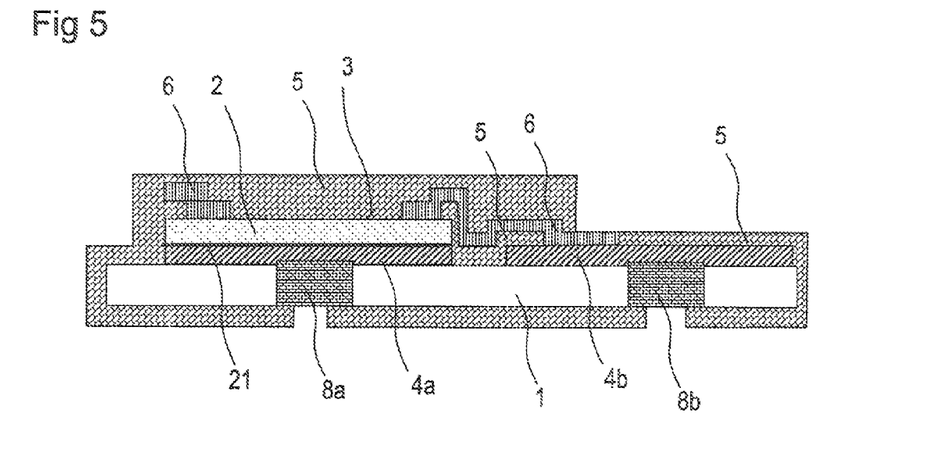
FIG. 5 shows a schematic side view of an example of the radiation-emitting component in which the entire outer surface is surrounded by the passivation layer with the exception of the contact surface.

FIG. 5 shows an example, of the radiation-emitting component in the schematic side view. The carrier 1 comprises a first through-connection 8a and a second through-connection 8b. As a result of the through-connections the first contact structure 4a, or the second contact structure 4b, can be electrically conductively contacted by the underside of the component. The second contact layer 6 in this example is formed in the area where it runs in a frame-shaped manner on the radiation exit surface 3 of the semi-conductor chip 2. The radiation exit surface 3 is electrically conductively connected to the second contact structure 4b via the second contact layer. The entire component is completely encased by the passivation layer 5 with the exception of the contact surfaces of the two through-connections 8a and 8b and a section of the second contact layer 6. Consequently, the entire component is protected from environmental influences.

The component illustrated in FIG. 5 is designed using the first and the second through-connection 8a, 8b preferably as a surface mountable component.

Figure 6:
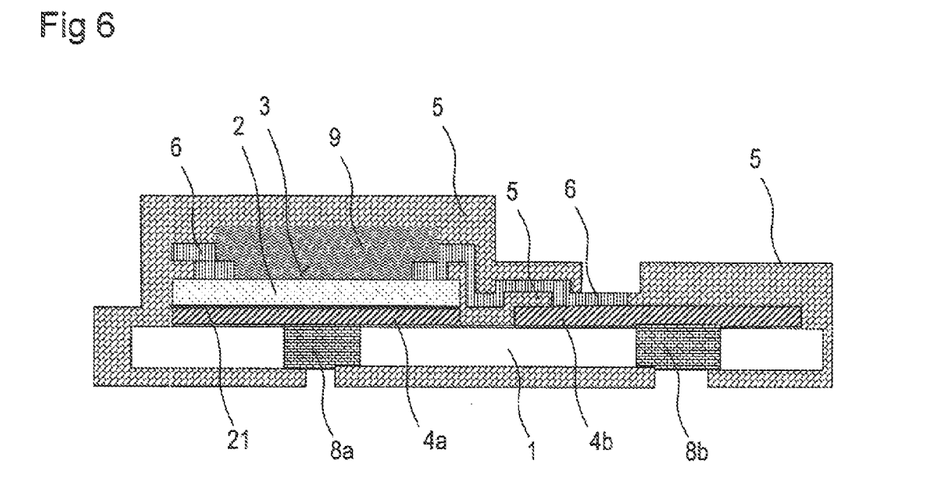
FIG. 6 shows a schematic side view of an example of the radiation-emitting component which comprises an optical element in the form of a converter.

The example illustrated in the schematic side view in FIG. 6 comprises a comparable composition represented in FIG. 5. The example represented in FIG. 6 additionally comprises an optical element 9. The optical element 9 represented in FIG. 6 is a conversion layer. This conversion layer 9 can, for example, comprise a converting substance by which the radiation emitted by the semiconductor chip 2, or also only wavelength ranges of this radiation, is modified in its wavelength. This can be effected, for example, as a result of the radiation emitted by the semi-conductor chip 2 being absorbed by the conversion substance, and a radiation being emitted by the conversion substance which has another wavelength than the radiation which was absorbed by the conversion substance. In the example represented in FIG. 6, the entire radiation emitted by the semi-conductor chip 2 passes through the optical element 9.

Figure 7A:
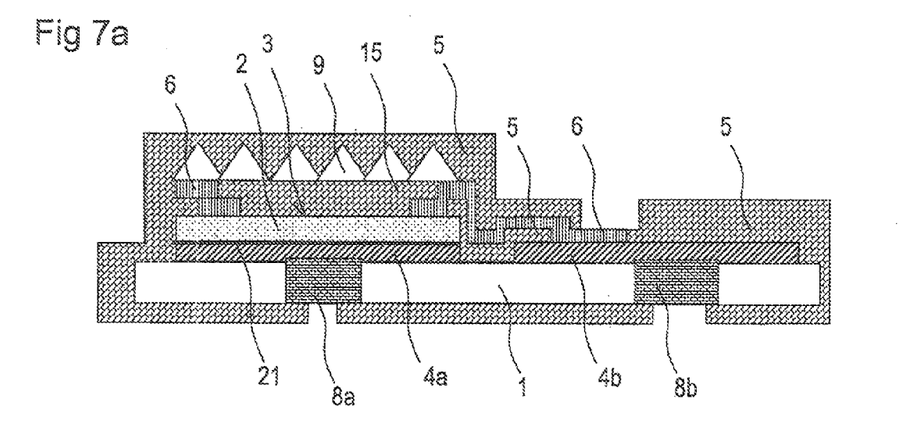
FIG. 7a shows a schematic side view of an example of a radiation-emitting component which comprises an optical element in the form of pyramid filters.

The example represented in FIG. 7a. has a comparable composition to the example which is represented in FIG. 5.

The example represented in FIG. 7a, however, additionally comprises an optical element 9. On the radiation exit surfaces, there is an equalizing layer 15 on which the optical element 9 is arranged. The equalizing layer 15 can act inter alia to planarize the surface of the radiation exit surface 3. The upper surface of the optical element 9, i.e., the surface which is facing away from the semi-conductor chip 2, is also provided with a passivation layer 5. The optical element 9 in this example concerns pyramid filters. The passivation layer 5 can also here comprise an even layer thickness in the section in which it runs to the pyramid filters. By virtue of these filters, the radiation emitted by the semi-conductor chip 2 can be deflected in its spatial direction.

Figure 7B:
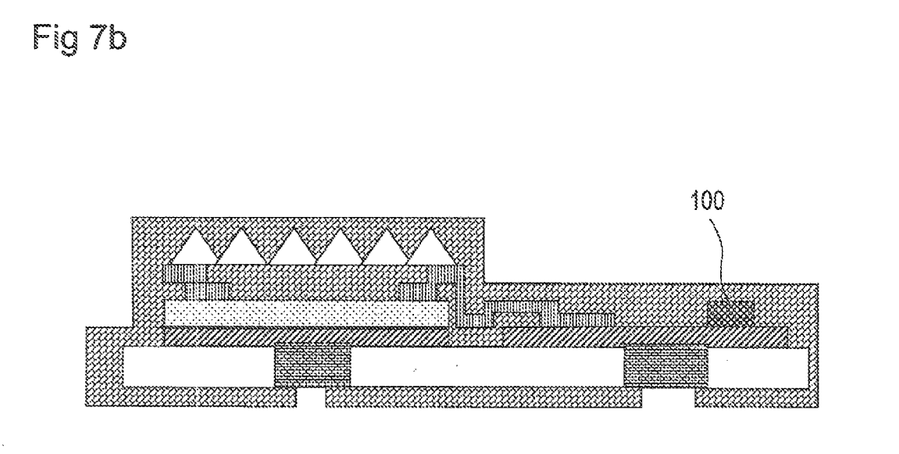
FIG. 7b shows a schematic side view of an example of the radiation-emitting component which comprises a passive component.

The example represented in FIG. 7b corresponds to the example as represented in FIG. 7a. However it additionally contains a passive component 100. This passive component 100 is arranged on the second contact structure and is likewise completely enclosed by the passivation layer 5. The passive component 100 can be, for example, a flyback diode or a resistor.

Figure 8A:
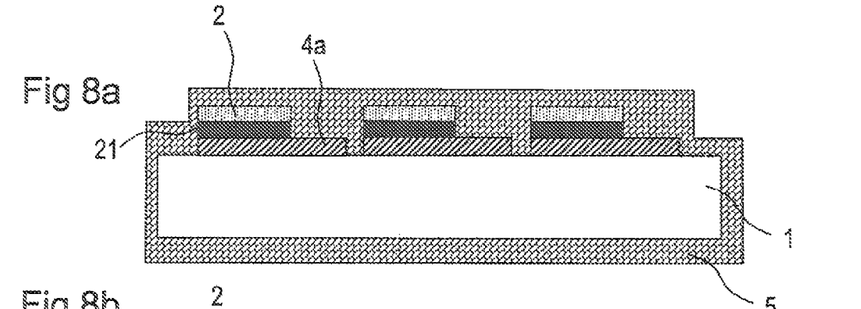
FIGS. 8a to 8d show a number of radiation-emitting components in different method stages.

In FIGS. 8a to 8d, three radiation-emitting components in each case in different method stages are illustrated. In FIG. 8a, in each case on the carrier 1, a first contact structure 4a is arranged and a semi-conductor chip 2 which is both mechanically and electrically conductively connected to the first contact structure 4a via the first contact layer 21. The entire carrier 1 and the three components are in each case completely surrounded by the passivation layer 5.

Figure 8B:
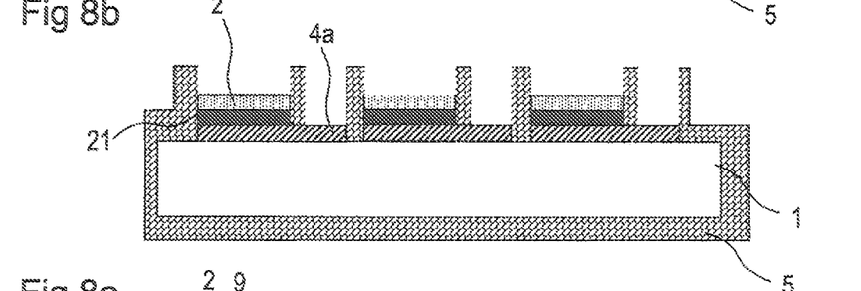

For the method stage represented in FIG. 8b, the passivation layer 5 was ablated over the semi-conductor chip 2 and over the first contact structure 4a in a section on which no first contact layer 21 is arranged. The removal of the passivation layer 5 can, for example, take place by RIE plasma etching ("reactive ion etching") with a fluorinated gas (e.g., $NF_3$, $CHF_3$, $CF_4$ or $SF_6$).

Figure 8C:
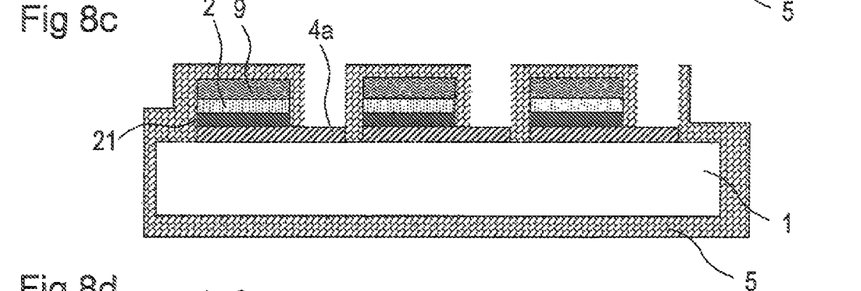

In the method stage represented in FIG. 8c, an optical element 9 is applied on the semiconductor chip 2. The optical element 9 is in this example a conversion layer. The application of the conversion layer can here, for example, be effected by small plates which comprise a converter material. The thickness of the conversion layer can, for example, be 20 μm. A YAG ceramic which is doped, for example, with Ce can also be used. In this case, the thickness would be, for example, 100 μm. After the application of the optical element 9, a passivation layer 2 was again applied over the optical element 9.

Figure 8D:
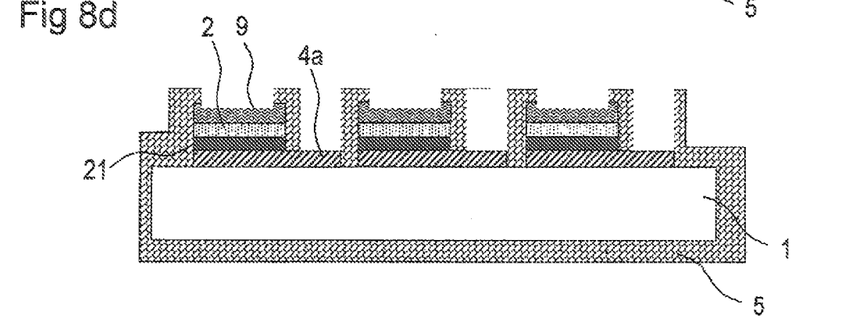

In the method stage illustrated in FIG. 8d, a section of the passivation layer 5 which runs over the optical element 9 was removed again. This removal of the passivation layer can, for example, be effected by means of RIE plasma etching ("reactive ion etching") with a fluorinated gas. By exposing the optical element 9 the absorption of the emitted radiation can be minimized.

In FIGS. 9a to 9d, an example of the radiation-emitting component in four different method stages is illustrated, in each case in an overview.

Figure 9A:
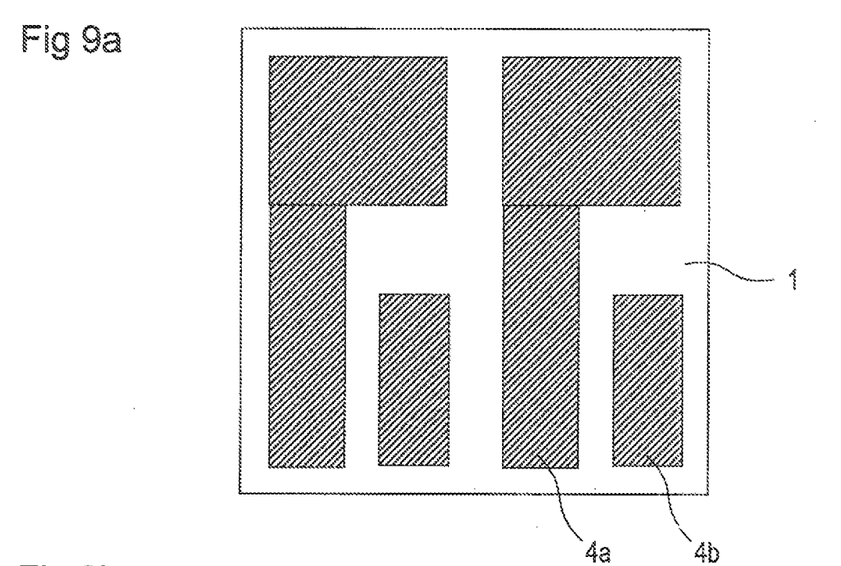
FIGS. 9a to 9d show a radiation-emitting component in the schematic overview in different method stages.

FIG. 9a shows the carrier 1 on which in each case for two radiation-emitting components the first contact structure 4a and the second contact structure 4b are represented.

Figure 9B:
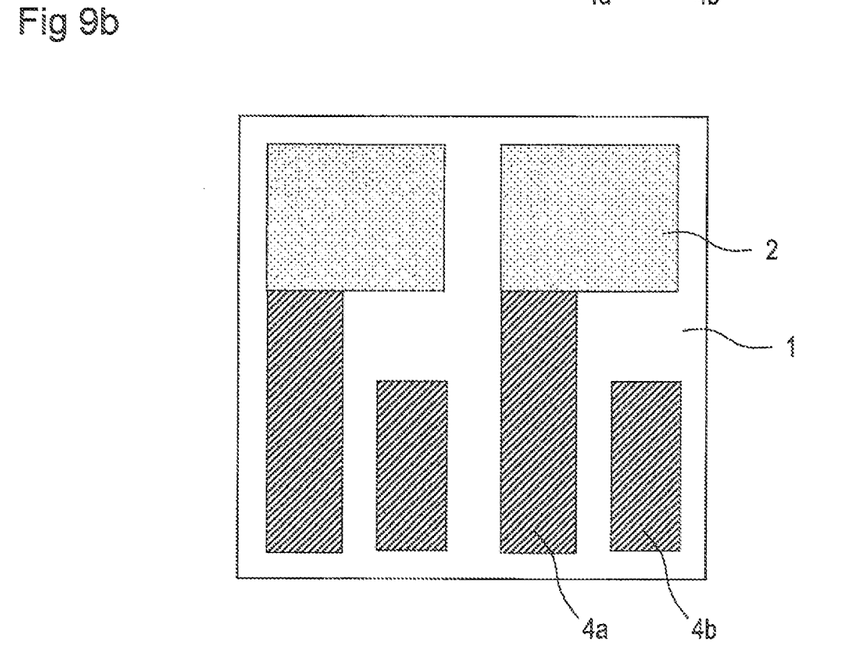

FIG. 9b shows an which, for example, could arise from the components represented in FIG. 9a, which on a section of the first contact structure 4a, in each case a semi-conductor chip 2 is applied. The application of the semi-conductor chip 2 can, for example, be effected by bonding, soldering or adhering. Between the semi-conductor chip 2 and the first contact structure 4a, a first contact layer 21 can be arranged.

Figure 9C:
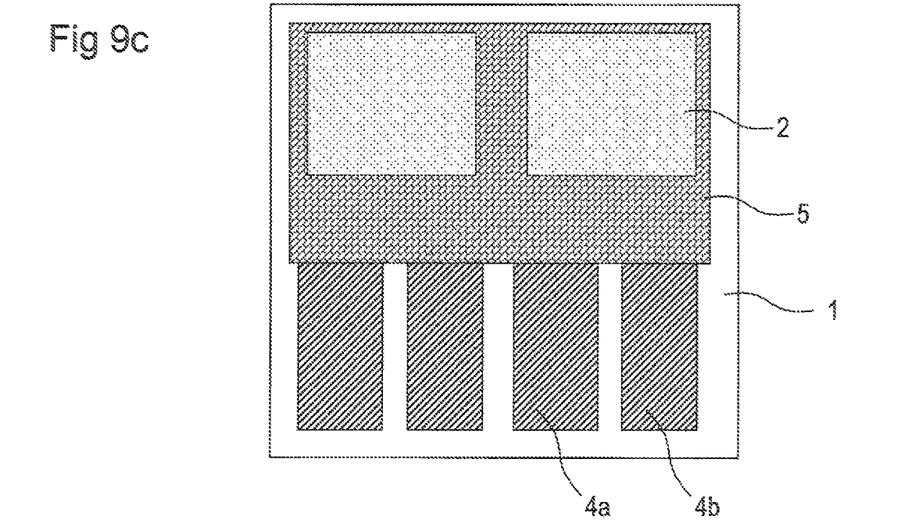

The method stage represented in FIG. 9c can, for example, arise from the method stage as represented in FIG. 9b, as a result of the fact that a passivation layer 5 was applied. The passivation layer 5 encloses in each case the semi-conductor chip 2. The passivation layer 5 can, for example, be deposited by chemical vapor deposition (CVD), preferably by plasma enhanced gas vapor deposition (PECVD).

Figure 9D:
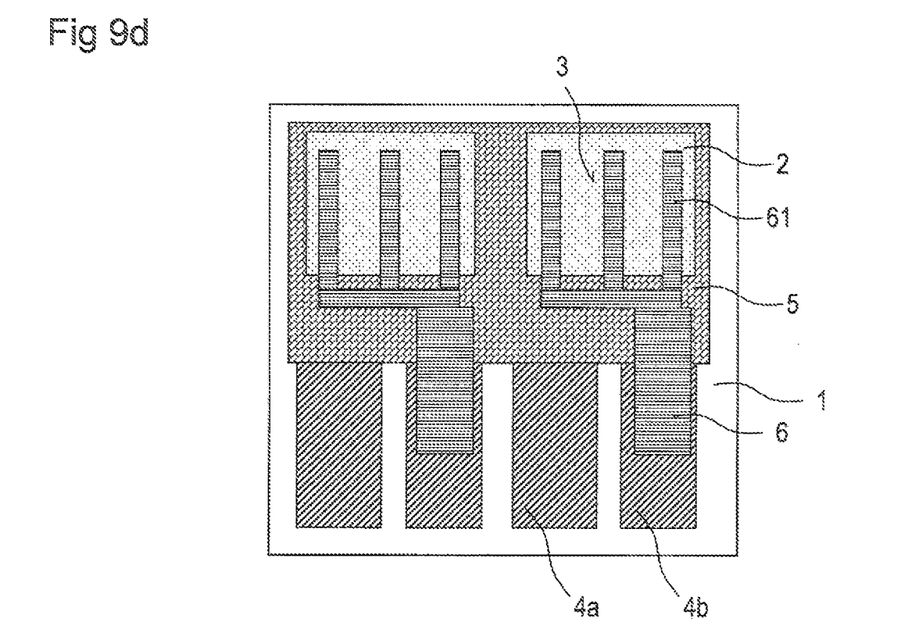

The method stage represented in FIG. 9d corresponds to the example as it is represented in FIG. 2. This could, for example, arise from the method stage as is represented in FIG. 9c, as a result of the fact that on each component in each case the second contact layer 6 has been applied. The second contact layer 6 is formed here in sections in which it runs on the semi-conductor chip 2 as contact webs 61.

In a further method step which is not represented as a figure, the now exposed radiation exit surface 3 and the contact webs 61 could also be coated with a passivation step 5. Consequently the entire semi-conductor chip 2 would then be protected by the passivation layer from environmental influences.

This disclosure is not limited by the description based in the examples, but comprises any new feature and any combination of features, even if the feature of combination itself is not explicitly specified in the appended claims or the examples.

The invention claimed is:

1. A radiation-emitting component comprising:
a carrier,
a semi-conductor chip arranged on the carrier, wherein the semi-conductor chip has an active layer to generate electromagnetic radiation, and a radiation exit surface,
a first and a second contact structure that electrically contacts the semi-conductor chip,
a first and a second contact layer, wherein the semi-conductor chip is electrically conductively connected to the first contact structure via the first contact layer and to the second contact structure via the second contact layer,
a passivation layer arranged on the semi-conductor chip, wherein the passivation layer comprises an organic polymer, with the general formula (I):

(I)

wherein $R^1$ to $R^{16}$ are in each case independent from one another, may be H, $CH_3$, F, Cl or Br, and n has a value from 10 to 500,000.

2. The radiation-emitting component according to claim 1, wherein $R^1$, $R^2$, $R^7$, $R^8$, $R^9$, $R^{10}$, $R^{15}$ and $R^{16}$ in each case are H.

3. The radiation-emitting component according to claim 1, wherein at least sections of the passivation layer comprise the outermost layer of the component.

4. The radiation-emitting component according to claim 1, wherein the passivation layer is arranged on the radiation exit surface.

5. The radiation-emitting component according to claim 1, further comprising at least one optical element is arranged on the radiation exit surface of the semi-conductor chip.

6. The radiation-emitting component according to claim 5, wherein the optical element comprises a conversion layer or a filter.

7. The radiation-emitting component according to claim 5, wherein the passivation layer is arranged at least on sections of a surface of the optical element facing away from the semi-conductor chip.

8. The radiation-emitting component according to claim 1, wherein the passivation layer electrically insulates the first contact structure from the second contact structure.

9. The radiation-emitting component according to claim 1, wherein the passivation layer electrically insulates the second contact layer from the first contact structure.

10. The radiation-emitting component according to claim 1, wherein the second contact layer is arranged in a frame-shape on the radiation exit surface of the semi-conductor chip.

11. The radiation-emitting component according to claim 1, wherein the second contact layer has contact webs arranged on the radiation exit surface of the semi-conductor chip.

12. The radiation-emitting component according to claim 1, wherein, through the carrier, there is a first and a second through-connection, and the first through-connection is electrically conductively connected to the first contact structure and the second through-connection is electrically conductively connected to the second contact structure.

13. The radiation-emitting component according to claim 1, wherein the component is formed as a thin-film chip.

14. A method for manufacturing a radiation-emitting component comprising:
A) providing a carrier which comprises a first and a second contact structure,
B) mechanically and electrically conductive connecting a semi-conductor chip to the first contact structure via a first contact layer,
C) mechanically and electrically conductive connecting the semi-conductor chip to the second contact structure via a second contact layer,
D) applying a passivation layer on at least sections of the semi-conductor chip,
wherein the passivation layer comprises an organic polymer with the general formula (I):

wherein $R^1$ to $R^{16}$ are in each case independent from one another, may be H, $CH_3$, F, Cl or Br, and n has a value from 10 to 500,000.

15. The method according to claim 14, wherein the passivation layer is applied by a plasma method.

16. The radiation-emitting component according, to claim 6, wherein the passivation layer is arranged at least on sections of a surface of the optical element facing away from the semi-conductor chip.

* * * * *